United States Patent [19]
Lan et al.

[11] Patent Number: 6,127,850
[45] Date of Patent: Oct. 3, 2000

[54] LOW POWER CLOCK BUFFER WITH SHARED, CLOCKED TRANSISTOR

[75] Inventors: Jiann-Cherng James Lan, San Jose; Sudarshan Kumar, Fremont, both of Calif.

[73] Assignee: Intel Corporation, Santa Clara, Calif.

[21] Appl. No.: 09/346,108

[22] Filed: Jun. 30, 1999

[51] Int. Cl.[7] .............................................. H03K 19/096
[52] U.S. Cl. ............................. 326/98; 326/104; 326/108
[58] Field of Search ............................. 326/98, 104, 108, 326/119

[56] References Cited

U.S. PATENT DOCUMENTS 5,831,453  11/1998  Stamoulis et al. ...................... 326/98
6,049,230  4/2000  Durham et al. ......................... 326/98

Primary Examiner—Tan T. Nguyen
Attorney, Agent, or Firm—David J. Kaplan

[57] ABSTRACT

A first pull-up transistor has a gate coupled to a clock signal line and a drain coupled to both a first pull-down transistor and a voltage clamp. A second pull-up transistor has a gate that is also coupled to the clock signal line and a drain coupled to both a second pull-down transistor and a voltage clamp. A shared pull-down transistor has a gate that is also coupled to the clock signal line and a drain coupled to both the first and second pull-down transistors. This circuit may be found useful in clock buffering applications.

18 Claims, 5 Drawing Sheets

LOW POWER CLOCK BUFFER WITH SHARED, CLOCKED TRANSISTOR

The present invention relates to integrated circuits and more particularly to a clock buffer that shares a clock-gated pull-down transistor for reduced power consumption in a processor.

BACKGROUND

Computer systems, from small handheld electronic devices to medium-sized mobile and desktop systems to large servers and workstations, are becoming increasingly pervasive in our society. Computer systems typically include one or more processors. A processor manipulates and controls the flow of data in a computer by executing instructions. Decreasing the size of the processor and reducing its power consumption lowers the cost and improves the reliability of the processor. Processor designers employ many different techniques to decrease processor size and to reduce power consumption to create less expensive and more robust computers for consumers.

Typically, for a given frequency and transistor size, circuits having more transistors that are actively switched tend to consume more power than circuits having fewer transistors that are actively switched. Therefore, designers strive to reduce the number of actively switched transistors, such as those that are gated (or clocked) by a high frequency clock signal. These transistors include, for example, clock buffer transistors having gates coupled to a clock signal line.

Unfortunately, to increase processor performance, the total transistor count of the processor typically must increase. Thus, there is a constant struggle between the need for processor designers to increase the performance of a processor and the need to reduce the number of clocked transistors in the processor to reduce power consumption. The present invention addresses this struggle.

SUMMARY OF THE INVENTION

A first pull-up transistor has a gate coupled to a clock signal line and a drain coupled to both a first pull-down transistor and a voltage clamp. A second pull-up transistor has a gate that is also coupled to the clock signal line and a drain coupled to both a second pull-down transistor and a voltage clamp. A shared pull-down transistor has a gate that is also coupled to the clock signal line and a drain coupled to both the first and second pull-down transistors.

BRIEF DESCRIPTION OF THE DRAWINGS

The present invention is illustrated by way of example and not limitation in the accompanying figures in which like references indicate similar elements and in which.

DETAILED DESCRIPTION

In accordance with an embodiment of the present invention, the power consumption and size of a multi-input clock buffer is reduced by sharing a single, clocked, pull-down transistor. In other words, each NAND gate of the multi-input clock buffer includes the same, clocked, pull-down transistor. Such a circuit may be used to replace any multi-input clock buffer that receives mutually exclusive input signals, such as the clock buffer controlling the word lines in a register address decoder. Because the input signals are mutually exclusive, the shared pull-down transistor need not be excessively large because only one NAND gate of the buffer is pulled down at any given time. As a result, there is a significant power savings over a multi-input clock buffer having a separate, clocked, pull-down transistor dedicated to each NAND gate.

A more detailed description of embodiments of the present invention, including various configurations and implementations, is provided below.

As used herein, the term "mutually exclusive" means that under normal operating conditions, only one signal at a time is active when the clock signal is active, wherein "active" refers to a logic level state that is defined as "high" or "low" for a particular signal. The terms "source" and "drain", as used herein, may be used interchangeably to identify either the source or drain of a p or n-channel transistor. A "pull-up" transistor is a transistor that, when activated (i.e. turned on), has a tendency to raise the voltage level at its drain, "pulling" it (or driving it) up to the approximate voltage level at its source (which is typically close to the supply voltage level). This may also be referred to as charging a node. A "pull-down" transistor is a transistor that, when activated, has a tendency to lower the voltage level at its drain, "pulling" it (or driving it) down to the approximate voltage level at its source (which is typically close to ground). This may also be referred to as draining a node.

An "input node" is a physical, electrically conductive portion of a circuit that receives an electrical signal, as distinguished from an "input signal" which is the electrical signal itself. Typically, an input node is a transistor gate. An "output node" is a physical, electrically conductive portion of a circuit that sends (or drives) an electrical signal, as distinguished from an "output signal" which is the electrical signal itself. Typically, an output node is a transistor drain. An input signal is provided to an input node via an input signal line. An output signal is sent from an output node via an output signal line. A "voltage clamp" is a device that provides a feedback signal to its input node in which the feedback signal has a tendency to reinforce (or "clamp") a voltage at its input node.

Figure 1:
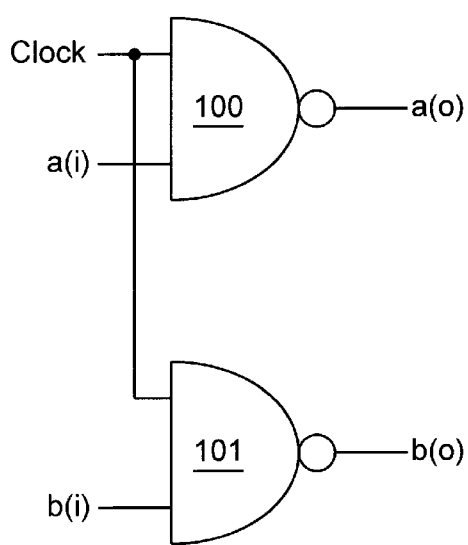
FIG. 1 is a dual input clock buffer gated by a clock signal in logic diagram form.

FIG. 1 is a dual input clock buffer gated by a clock signal in logic diagram form. A clock signal is transmitted to the upper input nodes of each of NAND gates 100 and 101 via a clock signal line. A first input signal, a(i), is transmitted to the lower input node of NAND gate 100 via a first input signal line, and a second input signal, b(i), is transmitted to the lower input node of NAND gate 101 via a second input signal line. Output signal a(o) at the output node of NAND gate 100 is the result of a logical NAND function applied to the clock signal and input signal a(i). Output signal b(o) at the output node of NAND gate 101 is the result of a logical NAND function applied to the clock signal and input signal b(i).

Figure 2:
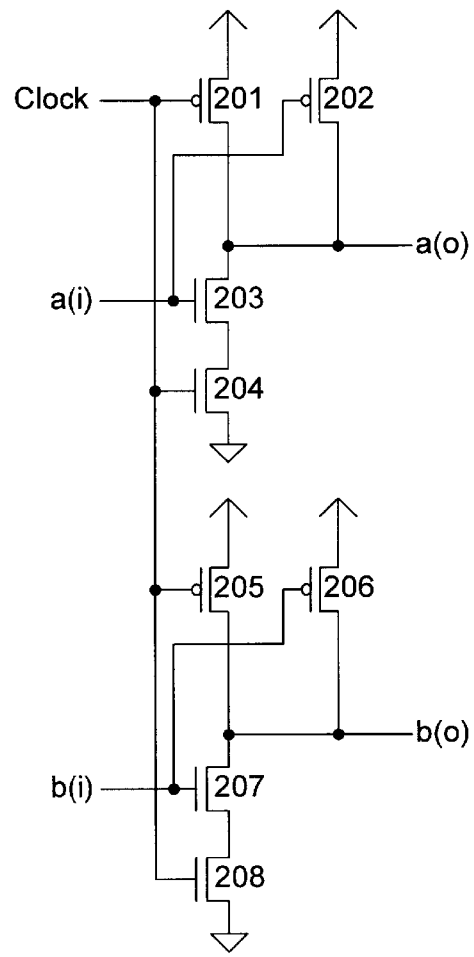
FIG. 2 is the dual input clock buffer of FIG. 1 in circuit diagram form.

FIG. 2 is the dual input clock buffer of FIG. 1 in circuit diagram form. Each of NAND gates 100 and 101 of FIG. 1 is shown as separate circuit blocks in FIG. 2. For example, NAND gate 100 includes pull-up transistor 201 and pull-down transistor 204, both coupled to the clock signal line for gating by the clock signal. NAND gate 100 further includes pull-up transistor 202 and pull-down transistor 203, both coupled to the first input signal line for gating by input signal a(i). NAND gate 101 includes pull-up transistor 205 and pull-down transistor 208, both coupled to the clock signal line for gating by the clock signal. NAND gate 101 further includes pull-up transistor 206 and pull-down transistor 207, both coupled to the second input signal line for gating by input signal b(i).

Note that clocked pull-down transistors 204 and 208 of FIG. 2 are toggled with each clock pulse. In a typical processor in which the frequency of the clock signal is high and the clock signal is applied to numerous pull-down transistors, this constant toggling of the pull-down transistors can amount to a substantial power drain. Reducing the number of pull-down transistors by, for example, combining transistors 204 and 208 into a single transistor might not substantially reduce this power drain. This is because the combined transistor would need to be twice the size (i.e. width) of the original transistors to maintain proper output signal timing for the case in which the clock signal, a(i), and b(i) all go high. Hence, there would be little or no power savings because the combined, larger transistor would consume about as much power as the separate, smaller transistors.

The result may be different, however, if the relationship between input signals a(i) and b(i) are taken into account. If, for example, a(i) and b(i) are mutually exclusive signals, then the combined pull-down transistor would not need to be twice the size of either transistor 204 or 208 of FIG. 2 because the combined pull-down transistor would not need to drain both NAND gates simultaneously. Instead, the combined transistor need be only slightly larger than either transistor 204 or 208 to overcome the additional source load from pull-down transistors 203 and 207. The result is the shared, clocked pull-down transistor 305 of FIG. 3A. Note that clocked pull-down transistors 204 and 208 of FIG. 2, which are in series with pull-down transistors 203 and 207, respectively, are approximately equal in size to transistors 203 and 207, respectively.

Figure 3A:
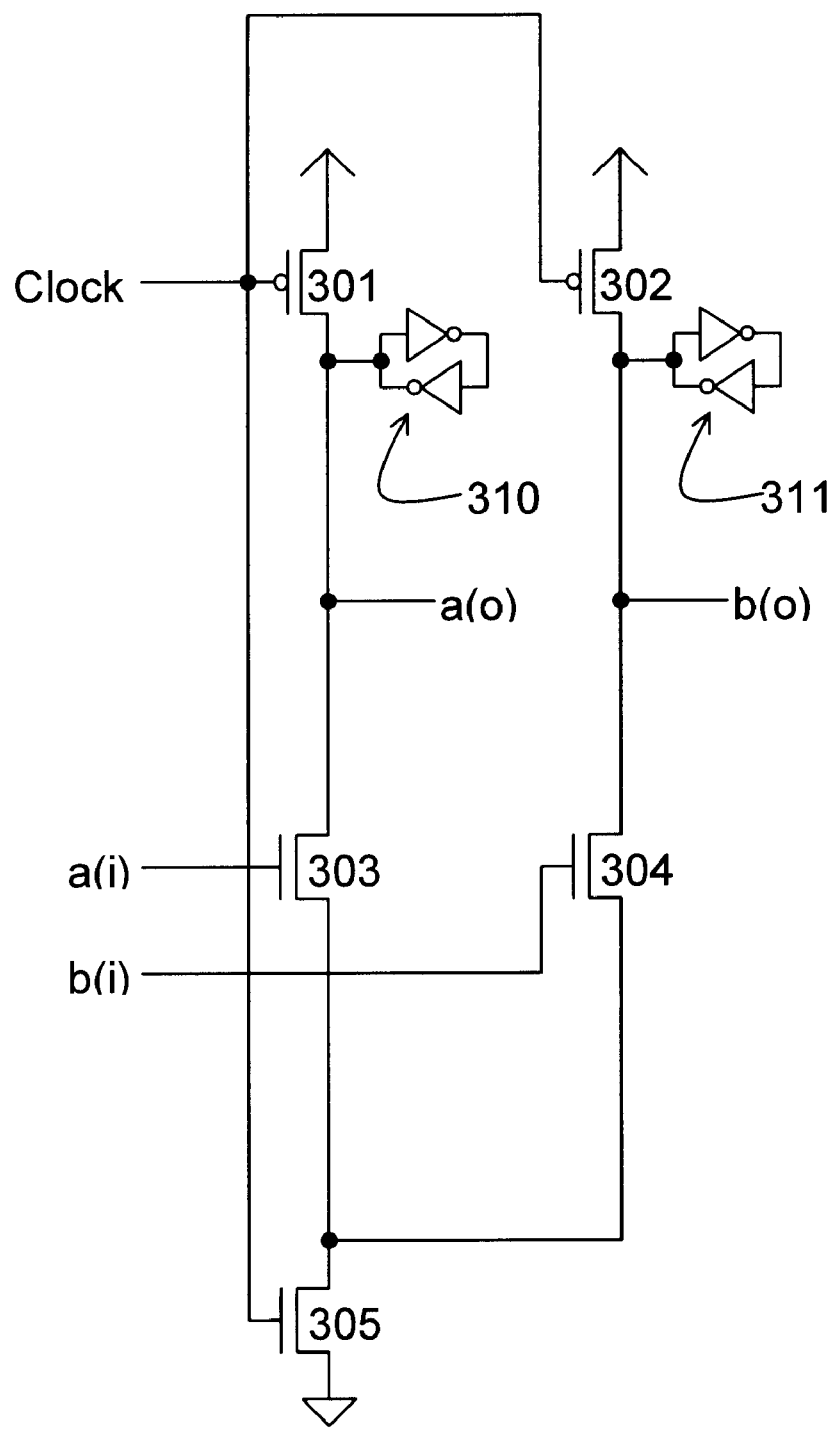
FIG. 3A is a dual input clock buffer circuit gated by a clock signal in accordance with one embodiment of the present invention.

FIG. 3A is a dual input clock buffer circuit gated by a clock signal in accordance with one embodiment of the present invention. The relationship between a(o) and b(o) to a(i), b(i), and the clock signal is the same as described above with respect to FIGS. 1 and 2. The clocked pull-down transistor 305, however, is now shared by both NAND gates. The first NAND gate includes clocked pull-up transistor 301 and clocked pull-down transistor 305, as well as pull-down transistor 303 gated by input signal a(i) transmitted along an input signal line coupled to the gate of transistor 303. The second NAND gate includes clocked pull-up transistor 302 and clocked pull-down transistor 305, as well as pull-down transistor 304 gated by input signal b(i) transmitted along an input signal line coupled to the gate of transistor 304. The first and second NAND gates both include (share) clocked pull-down transistor 305 which is coupled in series to both pull-down transistors 303 and 304.

As shown in FIG. 3A, the output node of the first NAND gate is coupled to the drain of clocked pull-up transistor 301 and to the drain of pull-down transistor 303, the source of which is coupled to the drain of shared, clocked, pull-down transistor 305. Similarly, the output node of the second NAND gate is coupled to the drain of clocked pull-up transistor 302 and to the drain of pull-down transistor 304, the source of which is also coupled to the drain of shared, clocked, pull-down transistor 305. The sources of pull-up transistors 301 and 302 are coupled to a Vcc power line of the integrated circuit and the source of shared pull-down transistor 305 is coupled to a ground line.

As described above, the size of pull-down transistor 305 is less than two times the size of either transistor 204 or 208 of FIG. 2. In other words, even though clocked pull-down transistor 305 drains (or drives low) the output nodes of both NAND gates of FIG. 3A, transistor 305 may be not much larger than the smaller of transistors 303 or 304, each of which drives only one or the other of the two NAND gate output nodes. Note, however, that transistor 305 may be slightly larger than the smaller of these transistors to overcome the source load of the transistors. For one embodiment of the present invention, transistor 305 is less than two times the size of the smaller of transistors 303 or 304. The use of shared pull-down transistor 305 in each NAND gate of FIG. 3A serves to not only reduce the power consumed by the overall multiplexer but also reduce its size.

Each NAND gate of FIG. 3A includes a separate voltage clamp coupled to its output node. The first NAND gate includes voltage clamp 310 and the second NAND gate includes voltage clamp 311. These clamps prevent their respective output nodes from floating when the clock signal is high and neither a(i) nor b(i) is high.

Figure 3B:
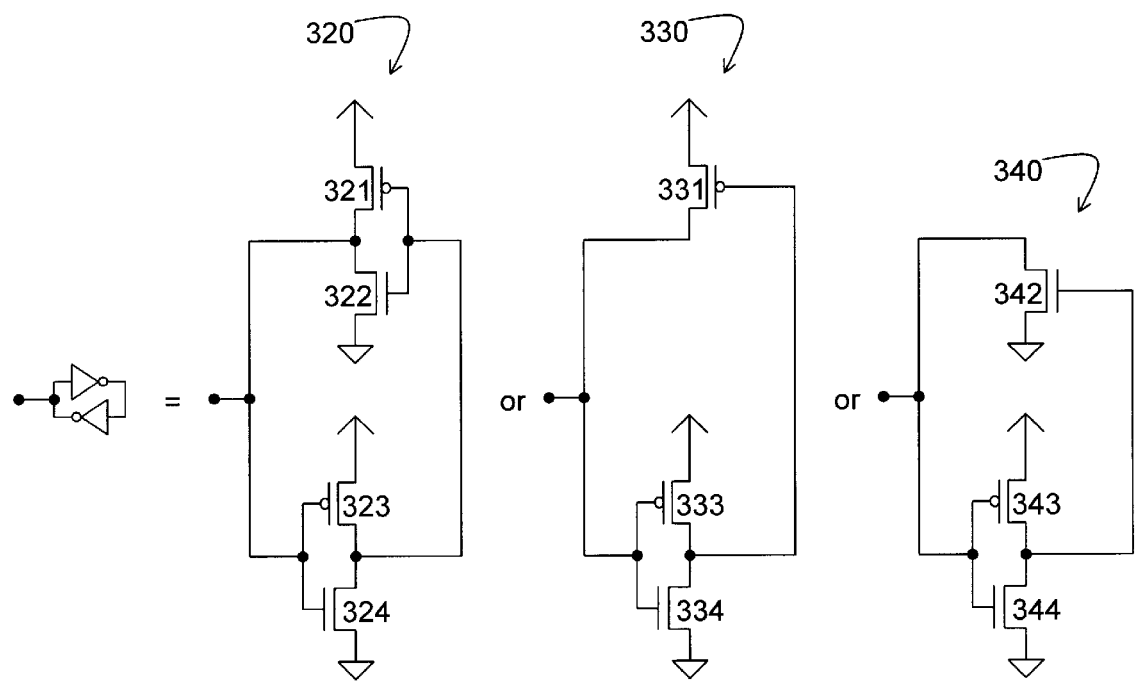
FIG. 3B shows alternate designs for the voltage clamp of FIG. 3A.

FIG. 3B provides three alternate designs for the voltage clamp of FIG. 3A (and FIGS. 4 and 6 described below). As shown, a voltage clamp is generally two inverters configured in a feedback loop. A voltage clamp typically provides a weak feedback voltage to the signal line being clamped such that the clamp can be easily overwhelmed by a moderately sized output (or driving) transistor (either pull-up or pull-down) on the signal line.

Voltage clamp 320 of FIG. 3B includes a full input inverter comprising transistors 323 and 324 and a full feedback inverter comprising transistors 321 and 322. Voltage clamp 320, therefore, provides both high and low signal clamping to a signal line. Voltage clamp 330 includes a full input inverter comprising transistors 333 and 334 and a half feedback inverter comprising only pull-up transistor 331. Voltage clamp 330, therefore, provides only high signal clamping to a signal line. Voltage clamp 330 may be found useful as voltage clamps 310 or 311 of FIG. 3A. Voltage clamp 340 includes a full input inverter comprising transistors 343 and 344 and a half feedback inverter comprising only pull-down transistor 342. Voltage clamp 340, therefore, provides only low (or ground) signal clamping to a signal line.

Figure 4:
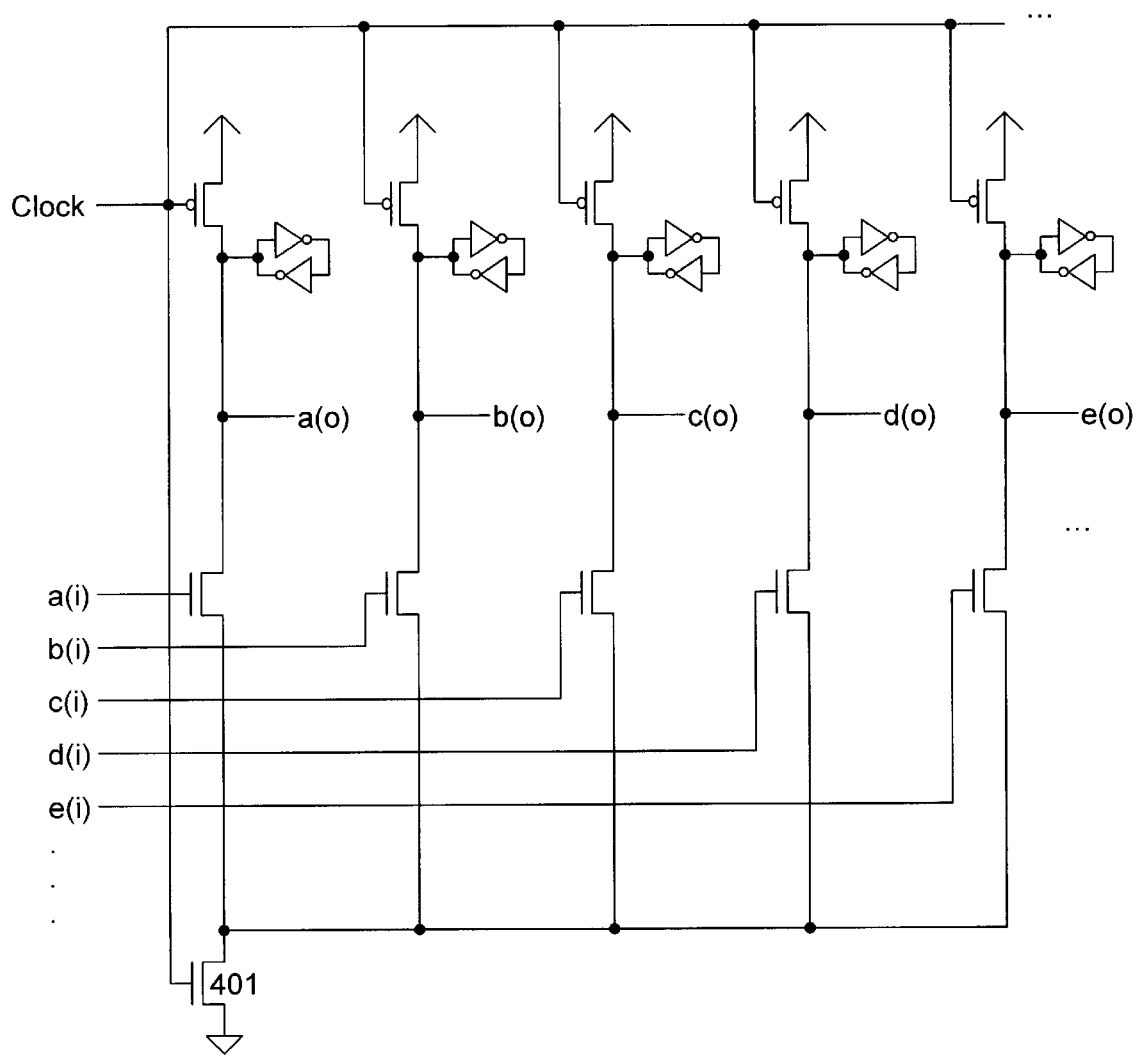
FIG. 4 is the circuit of FIG. 3A expanded to accommodate additional input signals.

FIG. 4 is the circuit of FIG. 3A expanded to accommodate additional input signals, each with an associated, additional NAND gate. Note that each of the five NAND gates associated with input/output signals a, b, c, d, and e respectively, all share pull-down transistor 401, the gate of which is coupled to the clock signal line. According to an embodiment of the present invention, a clock buffer having any number of input nodes and respective NAND gates may be designed in which all NAND gates have a shared, clocked, pull-down transistor in common.

Because the input signals to the buffer are mutually exclusive, the width of shared pull-down transistor 401 is less than the total number of input nodes times what would otherwise be the minimally required width of a separate, clocked, pull-down transistor coupled to any one of the buffer's NAND gates individually. For example, the width of shared pull-down transistor 401 is less than half the total number of input nodes times the width of the smaller of the pull-down transistors having a gate that receives input signal a(i), b(i), c(i), d(i), e(i), etc. For another embodiment, the width of shared pull-down transistor 401 is less than three times the width of the smaller of the pull-down transistors having a gate that receives input signal a(i), b(i), c(i), d(i), e(i), etc.

Figure 5:
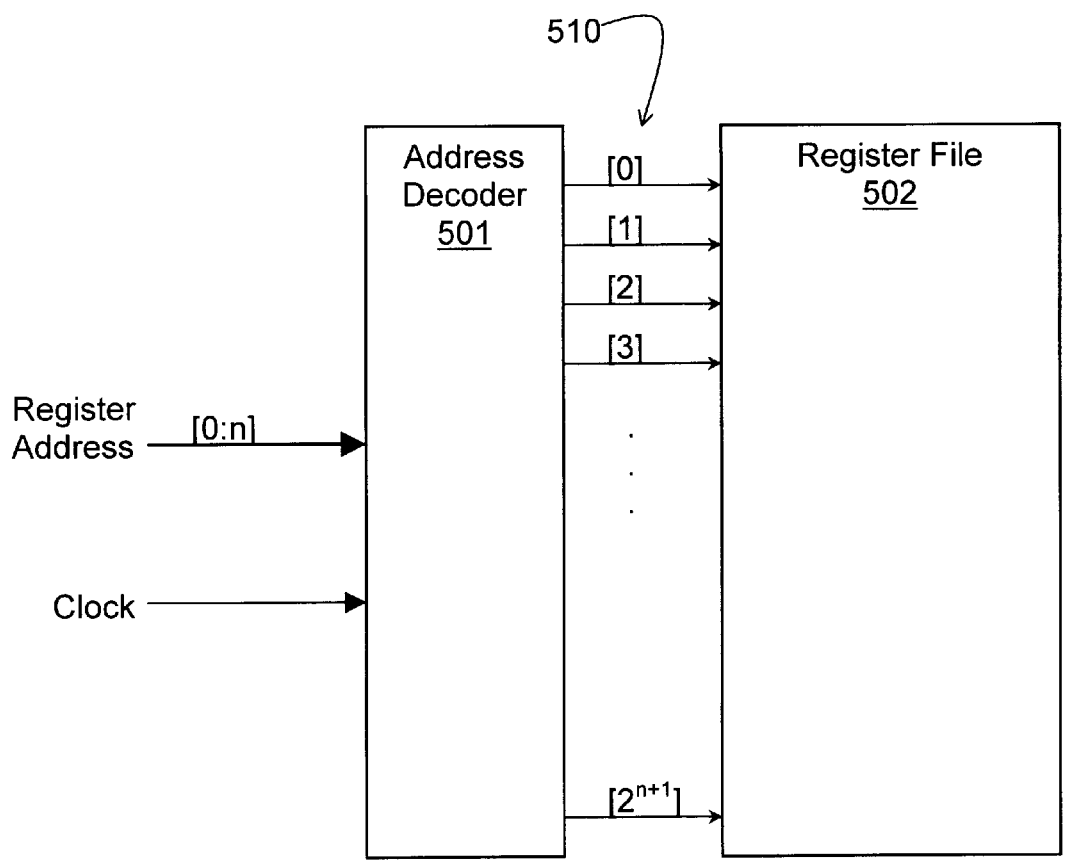
FIG. 5 is an application of the circuit of FIG. 3A in accordance with one embodiment of the present invention.

One practical application of an embodiment of the present invention is in an address decoder of a processor in which the output signal is a mutually exclusive word line signal transmitted to a memory region such as a register file. FIG. 5 shows this application. A register address [0:n] and clock signal is provided to address decoder 501. Address decoder 501 decodes address [0:n] into a single, associated address location within register file 502, and transmits a signal along the appropriate word line 510 synchronized by the clock signal.

Signals transmitted by word lines [0] through [$2^{n+1}$] of FIG. 5 are mutually exclusive. The output stage of address decoder 501 may include a clock buffer described above wherein the output signal line of each NAND gate of the buffer is one of word lines 510 coupled to register file 502. For example, for a register file having 64 entries, a clock buffer having 64 NAND gates all sharing the same clocked pull-down transistor may be implemented in the address decoder. For a register file having 128 entries, a clock buffer having 128 NAND gates all sharing the same clocked pull-down transistor may be implemented in the address decoder. For an alternate embodiment, any number of clock buffers having shared, clocked pull-down transistors may be combined to achieve the appropriate number of output signal lines. For example, an address decoder that addresses a register file having 128 entries may include a first clock buffer having 72 shared pull-down transistor NAND gates, a second clock buffer having 35 shared pull-down transistor NAND gates, and a third clock buffer having 21 shared pull-down transistor NAND gates.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A circuit comprising:
    a first pull-up transistor having a first gate coupled to a clock signal line and a first drain coupled to a first pull-down transistor and to a first voltage clamp;
    a second pull-up transistor having a second gate coupled to the clock signal line and a second drain coupled to a second pull-down transistor and to a second voltage clamp; and
    a shared pull-down transistor having a shared gate coupled to the clock signal line and a shared drain coupled to both the first and second pull-down transistors.

2. The circuit of claim 1, wherein a width of the shared pull-down transistor is less than three times a width of a smaller of the first and second pull-down transistors.

3. The circuit of claim 1, wherein a width of the shared pull-down transistor is less than twice a width of a smaller of the first and second pull-down transistors.

4. The circuit of claim 1, wherein both the first and second pull-down transistors are in series with the shared pull-down transistor.

5. The circuit of claim 4, wherein the first pull-down transistor includes a gate coupled to a first input signal line, and the second pull-down transistor includes a gate coupled to a second input signal line.

6. The circuit of claim 5, further comprising:
    a first output node coupled to the first drain, the first output node to provide a signal that is a result of a logical NAND between a clock signal on the clock signal line and a first input signal on the first input signal line; and
    a second output node coupled to the second drain, the second output node to provide a signal that is a result of a logical NAND between the clock signal and a second input signal on the second input signal line.

7. The circuit of claim 6, wherein the first drain is coupled to a first word line of a register file, and the second drain is coupled to a second word line of a register file.

8. The circuit of claim 4, further comprising:
    a third pull-down transistor in series with the first pull-down transistor and the shared pull-down transistor; and
    a fourth pull-down transistor in series with the second pull-down transistor and the shared pull-down transistor.

9. A clock buffer comprising:
    a plurality of clocked pull-up transistors numbering X in quantity, each having a gate coupled to a same clock signal line and a drain coupled to separate output nodes;
    a plurality of voltage clamps, each coupled to the separate output nodes;
    a plurality of pull-down transistors, each having a drain coupled to the separate output nodes and; and
    a shared pull-down transistor having a shared gate coupled to the same clock signal line, the shared pull-down transistor being in series with each of the plurality of pull-down transistors.

10. The clock buffer of claim 9, wherein a width of the shared pull-down transistor is less than half a width of a smaller of the plurality of pull-down transistors times X.

11. The clock buffer of claim 9, wherein a width of the shared pull-down transistor is less than twice a width of a smaller of the plurality of pull-down transistors.

12. The clock buffer of claim 9, wherein each of the separate output nodes is to provide a signal that is a result of a logical NAND between a clock signal on the clock signal line and an input signal applied to each gate of the plurality of pull-down transistors.

13. The clock buffer of claim 9, wherein each of the separate output nodes is coupled to each of a plurality of word lines of a register file.

14. A clock buffer comprising:
    a first NAND gate having an input node coupled to a clock signal line, an output node coupled to a first voltage clamp, and a shared pull-down transistor having a gate coupled to the clock signal line; and
    a second NAND gate having an input node coupled to the clock signal line, an output node coupled to a second voltage clamp, and the shared pull-down transistor.

15. The buffer of claim 14, further comprising a plurality of additional NAND gates each having an input node coupled to the clock signal line, an output node coupled to a separate voltage clamp, and including the shared pull-down transistor.

16. The buffer of claim 14, wherein the first NAND gate further includes an input node coupled to a first input signal line, the second NAND gate further includes an input node coupled to a second input signal line, and the first and second input signal lines are to transmit mutually exclusive input signals.

17. The buffer of claim 16, wherein the first and second voltage clamps are each coupled to word lines of a register file.

18. The buffer of claim 14, wherein the shared pull-down transistor includes a source coupled to a ground line.

* * * * *